United States Patent [19]

Hilberman

[11] 4,132,966

[45] Jan. 2, 1979

[54] SINGLE AMPLIFIER FREQUENCY DEPENDENT NEGATIVE RESISTOR

[75] Inventor: Dan Hilberman, Menlo Park, Calif.

[73] Assignee: Bell Telephone Laboratories, Incorporated, Murray Hill, N.J.

[21] Appl. No.: 825,536

[22] Filed: Aug. 18, 1977

[51] Int. Cl.² ............................................. H03H 5/04
[52] U.S. Cl. .................... 333/80 R; 330/107
[58] Field of Search ................ 307/230; 330/107, 109; 333/80 R, 80 T

[56] References Cited

U.S. PATENT DOCUMENTS

| 3,919,658 | 11/1975 | Friend | 330/69 |
| 3,990,025 | 11/1976 | Lee | 333/80 R |
| 3,993,959 | 11/1976 | Boctor | 330/109 X |
| 3,993,968 | 11/1976 | Lee | 333/80 R |
| 3,996,538 | 12/1976 | Schmidt | 333/80 R |
| 3,996,539 | 12/1976 | Lee | 333/80 R |
| 3,999,154 | 12/1976 | Schmidt | 333/80 R |

OTHER PUBLICATIONS

Rathore et al., *Novel Active RC Realisation etc.*, Proc. of IEE, vol. 123, No. 7, Jul. 1976, pp. 683, 684.

*Primary Examiner*—Paul L. Gensler
*Attorney, Agent, or Firm*—Richard B. Havill

[57] ABSTRACT

A single amplifier is arranged in an immittance network for simulating a pure frequency dependent negative resistor (FDNR).

12 Claims, 7 Drawing Figures

SINGLE AMPLIFIER FREQUENCY DEPENDENT NEGATIVE RESISTOR

BACKGROUND OF THE INVENTION

The invention relates to simulation networks and more particularly to a network for simulating a frequency dependent negative resistor (FDNR).

In spite of increased success of active resistor-capacitor filters, voice-frequency passive filters remain useful because of two properties. First of all, a doubly terminated lossless ladder network and some other lossless topologies have low sensitivity to component variations. Secondly, passive filters operate bilaterally.

These same two properties also can be useful in active resistor-capacitor filters when passive filters having inductors are transformed into an active equivalent form. Such a transformation is used for synthesizing a passive filter by means of an active filter. As a part of the transformation, inductors are replaced by resistors, resistors are replaced by capacitors and capacitors are replaced by a simulation network which is a frequency dependent negative resistor. The FDNR can be realized as an active integrated circuit.

There are two important types of network response. One response is the current conducted through network terminals to which a potential is applied. A second response is the potential created across a pair of terminals when a current is conducted through the network connected between the terminals. These responses are characterized, respectively, by the impedance and the admittance of the respective networks. The name immittance is associated with those responses whenever the impedance and the admittance are not to be singled out individually. The word immittance can be considered to be a contraction for the expression "impedance or admittance" and is understood to mean a form of network response.

In the aforementioned transformation, each impedance of the filter is divided by a complex frequency variable $s = j\omega$ so that each inductor becomes a resistor, each resistor becomes a capacitor, and each capacitor becomes an element with an impedance proportional to $1/s^2$ in the transformed equivalent network. This latter element is the one called the frequency dependent negative resistor (FDNR).

Although FDNR circuits have been developed previously, such prior art FDNR circuits are relatively complex. In addition to the FDNR, the prior art circuits also include one or more additional equivalent circuit elements which cannot be separated from the FDNR and therefore make it either difficult or impossible to simulate some transformed passive filter arrangements.

SUMMARY OF THE INVENTION

Therefore it is an object of the invention to provide a single amplifier immittance circuit.

It is also an object of this invention to provide a single amplifier FDNR arrangement.

It is a further object to simulate a pure FDNR with a single amplifier circuit.

These and other objects of the invention are realized by a single amplifier circuit including an input terminal and an amplifier having first and second inputs and an output, a conductance coupling the output to the first input, a capacitance coupling the input terminal to the first input, a conductance coupling the input terminal to the second input, conductances coupling the first and second inputs to ground, a capacitance directly coupling the output to the input terminal, and a conductance coupling the output to the input terminal, wherein an admittance between the input terminal and ground equals $Ds^2$, where D is a real number and s is the complex frequency variable.

BRIEF DESCRIPTION OF THE DRAWINGS

A better understanding of the invention may be derived by reading the following detailed description of several embodiments thereof with reference to the attached drawings wherein.

DETAILED DESCRIPTION

Figure 1:
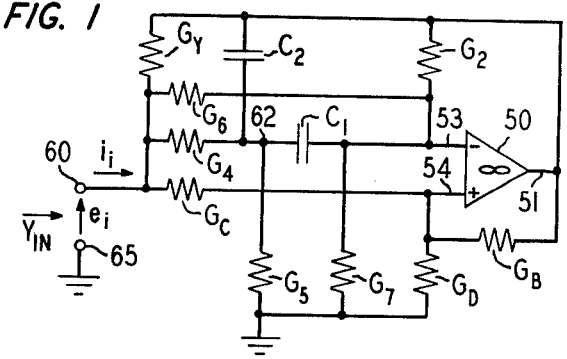
FIG. 1 is a schematic diagram of an illustrative embodiment of the invention.

Referring now to FIG. 1, there is shown a single amplifier FDNR circuit arrangement including an operational amplifier 50 having a large gain, an output terminal 51 and first and second input terminals 53 and 54. In all of the figures, components which are similar to one another have been given the same designation. The two input terminals 53 and 54 are designated respectively with negative and positive polarity signs. The negative polarity sign indicates that the input 53 is an inverting input. The positive polarity sign indicates that the input 54 is a non-inverting input. Although the polarity signs are used to identify the input terminals, the gain actually can have either a positive or a negative sign. The output 51 of the amplifier 50 is coupled through a conductance $G_2$ to the negative input terminal 53 and by way of a conductance $G_B$ to the positive input terminal 54.

An input terminal 60 of the FDNR is coupled through a series branch circuit including a conductance $G_4$ and a capacitor $C_1$ to the negative input terminal 53 of the amplifier 50. The input terminal 60 of the FDNR also is coupled through a conductance $G_6$ to the negative input 53 of the amplifier and by way of a conductance $G_C$ to the positive input 54 of the amplifier. The negative and positive inputs 53 and 54 of the amplifier, respectively, are coupled through conductances $G_7$ and $G_D$ to a ground reference terminal. A circuit node 62 between the conductance $G_4$ and the capacitor $C_1$ is coupled to the ground reference terminal through a conductance $G_5$. A capacitor $C_2$ directly couples the output 51 of the amplifier 50 to the circuit node 62, and a conductance $G_Y$ directly couples the output to the input terminal 60 of the FDNR arrangement. The capacitor $C_2$ is interposed in the circuit such that a first plate is connected directly to the output 51 and a second plate is connected directly to the circuit node 62. A first terminal of the conductance $G_Y$ is connected directly to the output 51, and a second terminal of the conductance $G_Y$ is connected directly to the input terminal 60. Another terminal 65 of the FDNR arrangement is connected directly to a reference potential or ground.

It is noted that in some respects the circuit of FIG. 1 is similar to an active RC filter circuit disclosed in U.S. Pat. No. 3,919,658, issued to J. J. Friend, except that in the circuit of FIG. 1 there is no arrangement for connecting a separate load device with output terminals and except that the conductance $G_Y$ is coupled directly between the output 51 of the amplifier 50 and the input terminal 60 of the FDNR. The input admittance $Y_{IN}$ of the embodiment of FIG. 1 is represented by the expression $$Y_{IN} = \frac{(v_2 s^2 + v_1 s + v_0)}{(d_2 s^2 + d_1 s + d_0)} \tag{1}$$

where $$v_2 = C_1 C_2 G_D (G_4 + G_C + G_6 + G_Y) \tag{2}$$

$$v_1 = [G_4 + G_C + G_6 + G_Y][(C_1 + C_2)(G_2 G_D - G_7 G_B) - C_1 C_5 G_B] + C_2(G_4 + G_Y)(G_6 G_D - G_7 G_C) + C_1 G_Y[G_D(G_4 + G_6) - G_C(G_5 + G_7)] \tag{3}$$

$$v_0 = G_1(G_6 + G_C + G_Y)(G_2 G_D - G_7 G_B) + G_4 G_5(G_2 G_A - G_3 G_B) + G_1 G_Y(G_6 G_D - G_7 G_C) \tag{4}$$

$$d_2 = C_1 C_2 G_A \tag{5}$$

$$d_1 = (C_1 + C_2)(G_2 G_A - G_3 G_B) - G_1 G_B C_1 \tag{6}$$

$$d_0 = G_1(G_2 G_A - G_3 G_B) \tag{7}$$

$$G_i \neq 1/R_i \text{ for } i = 1,2,3,4,5,6,7,A,B,C,D,Y \tag{8}$$

$$G_A \neq G_C + G_D \tag{9}$$

$$G_1 \neq G_4 + G_5 \tag{10}$$

$$G_3 \neq G_6 + G_7. \tag{11}$$

The denominator of the input admittance function is the same as that of the transfer function of the circuit arrangement shown in the aforementioned Friend patent. It is noted that the input admittance of the Friend circuit arrangement has not been investigated in the past, as a synthesis tool, because designers working with the Friend circuit have only been interested in the ratio of the output voltage to the input voltage. When the single amplifier biquad arrangement disclosed by Friend is used for an immittance synthesis, there is no concern for the output voltage. Instead there is a concern for the input current.

For determining a pure FDNR arrangement with the set of coefficients (2)–(7) mentioned above, one should make the input admittance equal to $Ds^2$, where D is a real number and s is the complex frequency variable. One solution for the set of equations is determined by eliminating the conductance $G_4$ through making it infinite. By making the conductance $G_4$ infinite, the second plate of the capacitor $C_2$ is connected directly to the input terminal 60. Thereby the capacitance $C_2$ directly couples the output of the amplifier to the input terminal. When one takes the limit in equations (1) through (11) with $G_4$ going to infinity, one obtains $$v_2 = C_1 C_2 G_D \tag{12}$$

$$v_1 = (C_1 + C_2)(G_2 G_D - G_7 G_B) - (C_1 G_5 G_B) + (C_2)(G_6 G_D - G_7 G_C) + (C_1 G_D G_Y) \tag{13}$$

$$v_0 = (G_6 + G_C + G_Y)(G_2 G_D - G_7 G_B) + (G_5)(G_2 G_A - G_3 G_B) + (G_Y)(G_6 G_D - G_7 G_C) \tag{14}$$

$$d_2 = 0 \tag{15}$$

$$d_1 = -G_B C_1 \tag{16}$$

$$d_0 = (G_2 G_A) - (G_3 G_B) \tag{17}$$

To realize an FDNR immittance, the following assignments can be made in equations (12) through (17): $G_B = 0$, $G_5 = 0$, and $G_6 = 0$. Then $$G_C = (G_Y)[(C_1/C_2) + (G_Y D/C_2^2)]/[1 - (G_Y^2 D/C_2^2 G_D)], \tag{18}$$

$$G_2 = (C_1 C_2 G_D)/(D)(G_C + G_D), \text{ and} \tag{19}$$

$$G_7 = (G_D) \{1 + [1 + (C_2/C_1)][G_2/G_Y]\}/[1 + (G_Y/G_2)]. \tag{20}$$

These equations give an input admittance $$Y_{IN} = v_2 s^2/d_0 \neq Ds^2 \tag{21}$$

so that $$D = (C_1 C_2 G_D)/(G_C + G_D)(G_2). \tag{22}$$

A positive value for the conductance $G_C$ is determined by choosing the free parameters, such as the conductance $G_Y$ and the capacitance $C_2$, to satisfy $$(G_Y^2 D)/(C_2^2 G_D) < 1. \tag{23}$$

Figure 2:
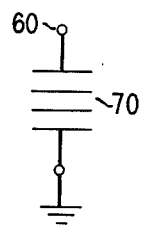
FIG. 2 is a symbolic representation of an FDNR element.

FIG. 2 shows a symbol 70 representing the circuit of FIG. 1 when it satisfies the equation (21). By so satisfying the conditions of equation (21), the circuit of FIG. 1 operates as a pure FDNR without any other equivalent circuit elements being connected thereto. Since the second terminal of the input port is grounded, FIG. 2 also shows the pure FDNR grounded.

Figure 3:
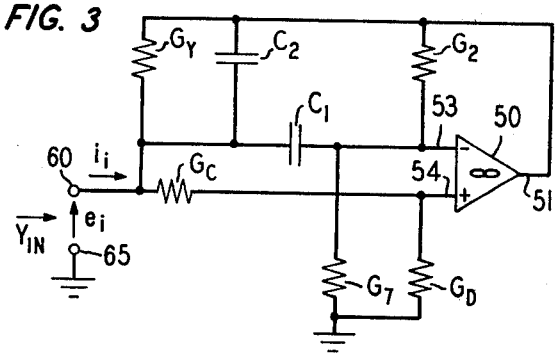
FIG. 3 is an alternative embodiment of the invention.

FIG. 3 is an alternative arrangement for the circuit of FIG. 1 wherein the conductance $G_4$ is infinite and the conductances $G_5$, $G_6$ and $G_B$ are zero to satisfy the conditions of equation (21). In FIG. 3, the capacitor $C_2$ is shown directly coupling the output of the amplifier 50 to the input terminal 60. The symbol 70 of FIG. 2 also represents the circuit of FIG. 3.

It is important to note that because the foregoing describes a pure FDNR arrangement, no component in the arrangement can be identified as a load device. The resulting FDNR is simply in a grounded configuration.

Figure 4:
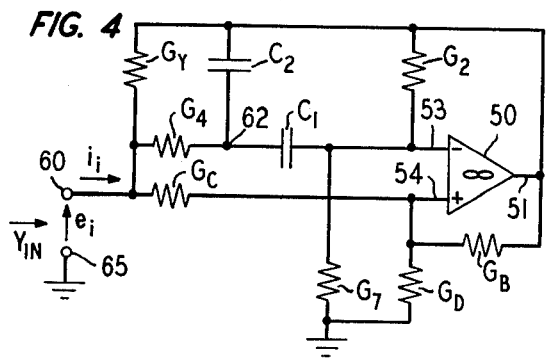
FIG. 4 is another alternative embodiment of the invention.

Referring now to FIG. 4, a circuit arrangement, which differs from that of FIG. 1 by the absence of conductances $G_5$ and $G_6$ because they are chosen to equal zero, exhibits an input inpedance function given by the following expression:

$$Z_{IN} = e_i/i_i = R + 1/Ds^2, \tag{24}$$

where $e_i$ equals input voltage and $i_i$ equals input current. The input impedance $Z_{IN}$ represents a series resonant immittance including an FDNR and a load resistance connected to ground. No single component in FIG. 4, however, can be identified specifically as the load resistance R.

A solution for the equations (12) through (17) is determined by setting $G_5$ and $G_6 = 0$, by choosing a constant $K_4 \geq 1$, and by choosing $$G_Y > 1/(RK_4)[1 + (C_1/C_2)]. \tag{25}$$

Then $$G_4 = (K_4 G_Y)[1+(C_1/C_2)] \quad (26)$$

$$G_C = G_Y\{K_4 C_1 + C_2 + (DRG_4^2)/(C_1+C_2)\}/(C_2)(K_4-1) \quad (27)$$

$$G_D = G_C/\{(R)(G_4+G_C+G_Y)-1\} \quad (28)$$

$$G_B = C_2(G_C+G_D)(C_1+C_2)/(RDG_4^2) \quad (29)$$

$$G_7 = [(G_C/C_1)\{(C_1+C_2)/(G_4 G_D) + (C_2)/(G_Y G_D + G_B/R)\}]^{-1} \quad (30)$$

$$G_2 = C_2\{C_1 G_4 + (G_7)(C_1+C_2)\}/(G_4^2 DR). \quad (31)$$

Figure 5:
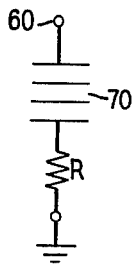
FIG. 5 is a symbolic representation of the embodiment of FIG. 4.

Referring now to FIG. 5 there is shown a symbolic representation of the circuit of FIG. 4, showing an FDNR 70 connected in a series circuit arrangement with a load resistance R further connected to ground.

Figure 6:
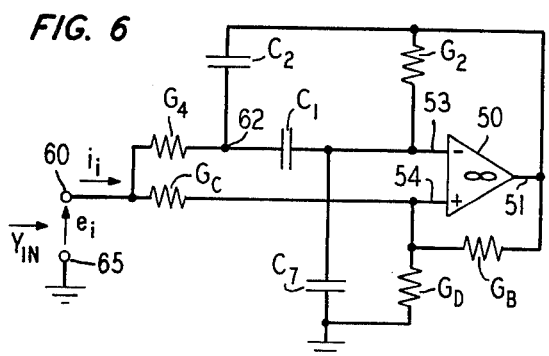
FIG. 6 is another alternative embodiment of the invention.

Referring now to FIG. 6, a further circuit arrangement, which differs from that of FIG. 1 by the absence of conductances $G_5$, $G_6$, and $G_Y$ because they are chosen to equal zero and by the substitution of a capacitance $C_7$ for the conductance $G_7$, exhibits an input admittance function given by the following expression:

$$Y_{IN} = i_i/e_i = G + Ds^2, \quad (32)$$

wherein $i_i$ equals input current and $e_i$ equal input voltage.

This input admittance $Y_{IN}$ represents a parallel resonant immittance including an FDNR and a conductance connected to ground. No specific component in FIG. 6 is identifiable as the conductance G.

A solution for the equations (12) through (17) is determined by setting conductances $G_5$, $G_6$, and $G_Y = 0$ and by replacing the conductance $G_7$ with a capacitance $C_7$ which couples the negative input of the amplifier 50 to the ground reference terminal. This arrangement provides the following set of coefficients for equation (1):

$$v_2 = (C_1 C_2 G_D)(G_4+G_C) - (G_B C_7)(C_1+C_2)(G_4+G_C) - G_4 G_C C_7 C_2 \quad (33)$$

$$v_1 = (G_2 G_D)(G_4+G_C)(C_1+C_2) - G_C G_4 G_B C_7 \quad (34)$$

$$v_0 = G_C G_D G_2 G_4 \quad (35)$$

$$d_2 = C_1 C_2 G_A - (C_7 G_B)(C_1+C_2) \quad (36)$$

$$d_1 = (C_1+C_2)(G_2 G_A - G_4 G_B) \quad (37)$$

$$d_0 = G_2 G_4 G_A \quad (38)$$

where $G_A$ is defined as in equation (9).
To realize the input admittance $$Y_{IN} = G + Ds^2 \quad (39)$$

one solution is to choose another constant $K > 1$ $$G_A = K[1+(C_1/C_7)] \quad (40)$$

$$\alpha \neq (C_7)(C_1+C_2)^2/(C_1 C_2)(C_1+C_7) \quad (41)$$

$$G_2 = (G_C)(K-1)/\alpha \quad (42)$$

$$G_4 = (G_C)(K-1) \quad (43)$$

$$G_B = (C_1 C_2 G_A)/(C_7)(C_1+C_2) \quad (44)$$

It is noted that the circuit of FIG. 6 uses a three capacitor arrangement rather than the simpler two capacitor arrangements of FIGS. 1, 3 and 4.

Figure 7:
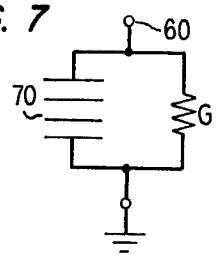
FIG. 7 is a symbolic representation of the embodiment of FIG. 6.

The circuit of FIG. 6 is shown symbolically in FIG. 7 as a parallel arrangement of a conductance G and FDNR 70 connected to ground.

The foregoing describes several illustrative embodiments of applicant's invention. These embodiments together with other embodiments obvious to those skilled in the art are considered to be included within the scope of the invention.

What is claimed is:

1. A circuit including an input terminal and further comprising
    an amplifier having first and second inputs and an output,
    a conductance $G_2$ coupling the output to the first input,
    a capacitance $C_1$ coupling the input terminal to the first input,
    a conductance $G_C$ coupling the input terminal to the second input,
    conductances $G_7$ and $G_D$, respectively, coupling the first and second inputs to ground,
    a capacitance $C_2$ directly coupling the output to the input terminal, and
    a conductance $G_Y$ directly connecting the output to the input terminal,
    wherein an admittance $Y_{IN}$ between the input terminal and ground equals $Ds^2$, where D is a real number and s is a complex frequency variable.

2. A circuit in accordance with claim 1 wherein
    the conductance $G_2$ equals $(C_1 C_2 G_D)/D(G_C+G_D)$,
    the conductance $G_C$ equals $(G_Y)(C_1/C_2 + G_Y D/C_2^2)/(1-G_Y^2 D/C_2^2 G_D)$,
    the conductance $G_7$ equals $(G_D)[1+(1+C_2/C_1)(G_2/G_Y)]/(1+G_Y/G_2)$,
    the conductance $G_Y$ and the capacitance $C_2$ are selected so that $G_Y^2 D/C_2^2 G_D < 1$, and
    the real number D equals $(C_1 C_2 G_D)/(G_C+G_D)(G_2)$.

3. A frequency dependent negative resistor (FDNR) circuit which utilizes a single amplifier to provide a desired admittance function between an input terminal of the FDNR circuit and a terminal having a fixed reference potential, the circuit comprising:
    a differential amplifier having first and second input terminals and having an output terminal;
    a first conductance connected to the output terminal of the amplifier and to the first input terminal of the amplifier;
    a second conductance connected to the FDNR input terminal and to the second input terminal of the amplifier;
    a first capacitance connected to the FDNR input terminal and to the first input terminal of the amplifier;
    a second capacitance directly coupling the output terminal of the amplifier to the FDNR input terminal;
    a third conductance connected to the first input terminal of the amplifier and to the reference terminal;
    a fourth conductance connected to the second input terminal of the amplifier and to the reference terminal; and
    a fifth conductance directly connecting the output terminal of the amplifier to the FDNR input terminal.

4. A circuit including an input terminal and further comprising
 an amplifier having first and second inputs and an output,
 means coupling the output by way of a conductance $G_2$ to the first input and by way of a conductance $G_B$ to the second input,
 a series branch circuit including a conductance $G_4$ and a capacitor $C_1$ connected between the input terminal and the first input,
 a conductance $G_6$ coupling the input terminal to the first input,
 a conductance $G_C$ coupling the input terminal to the second input,
 conductances $G_7$ and $G_D$, respectively, coupling the first and second inputs to ground,
 a conductance $G_5$ coupling a node between the conductance $G_4$ and the capacitor $C_1$ to ground,
 a capacitor $C_2$ directly coupling the output to the node, and
 a conductance $G_Y$ directly connecting the output to the input terminal,
 wherein an admittance between the input terminal and ground equals $Ds^2$, where D is a real number and s is a complex frequency variable.

5. A circuit in accordance with claim 4 wherein the admittance between the input terminal and ground equals $(v_2s^2+v_1s+v_0)/(d_2s^2+d_1s+d_0)$, where $v_2 = (C_1C_2G_D)(G_4+G_C+G_6+G_Y)$, $v_1 = (G_4+G_C+G_6+G_Y)[(C_1+C_2)(G_2G_D-G_7G_B)-\lambda C_1G_5G_B] + (C_2)(G_4+G_Y)(G_6G_D-G_7G_C) + (C_1G_Y[(G_D)(G_4+G_6) - (G_C)(G_5+G_7)]$, $v_0 = (G_1)(G_6+G_C+G_Y)(G_2G_D-G_7G_B) + (G_4G_5)(G_2G_A-G_3G_B) + (G_1G_Y)(G_6G_D-G_7G_C)$, $d_2 = C_1C_2G_A$, $d_1 = (C_1+C_2)(G_2G_A-G_3G_B) - (G_1G_BC_1)$, $d_0 = (G_1)(G_2G_A-G_3G_B)$, $G_A = G_C + G_D$, $G_1 = G_4 + G_5$, $G_3 = G_6 + G_7$, and $G_B = 0$, $G_4 = \infty$, $G_5 = 0$, and $G_6 = 0$.

6. A frequency dependent negative resistor (FDNR) circuit which utilizes a single amplifier to provide a desired admittance function between an input terminal of the FDNR circuit and a terminal having a fixed reference potential, the circuit comprising:
 a differential amplifier having first and second input terminals and having an output terminal;
 a first conductance connected to the amplifier output terminal and to the first input terminal of the amplifier;
 a second conductance connected to the amplifier output terminal and to the second input terminal of the amplifier;
 a circuit branch comprising a serial connection of a third conductance and a first capacitance, the conductive terminal of the circuit branch connected to the input terminal of the FDNR circuit and the capacitive terminal of the circuit branch connected to the first input terminal of the amplifier;
 a second capacitance directly coupling the amplifier output terminal to the circuit branch at a node intermediate the third conductance and the first capacitance;
 a fourth conductance connected to the FDNR input terminal and to the first input terminal of the amplifier;
 a fifth conductance connected to the FDNR input terminal and to the second input terminal of the amplifier;
 a sixth conductance connected to the first input terminal of the amplifier and to the reference terminal;
 a seventh conductance connected to the second input terminal of the amplifier and to the reference terminal;
 an eighth conductance connected to the circuit branch at the node intermediate the third conductance and the first capacitance and to the reference terminal; and
 a ninth conductance directly connecting the output terminal of the amplifier to the FDNR input terminal.

7. A circuit including an input terminal and further comprising,
 an amplifier having first and second inputs and an output,
 means coupling the output by way of a conductance $G_2$ to the first input and by way of a conductance $G_B$ to the second input,
 a series branch circuit including a conductance $G_4$ and a capacitance $C_1$ connected between the input terminal and the first input,
 a conductance $G_C$ coupling the input terminal to the second input,
 conductances $G_7$ and $G_D$, respectively, coupling the first and the second inputs to ground,
 a capacitance $C_2$ directly coupling the output to a node between the conductance $G_4$ and the capacitance $C_1$, and
 a conductance $G_Y$ directly connecting the output to the input terminal,
 wherein an impedance between the input terminal and ground equals $R + (1/Ds^2)$, where R is a resistance, D is a real number, and s is a complex frequency variable.

8. A circuit in accordance with claim 7 wherein a constant $K_4 \geq 1$, $G_Y > 1/(RK_4)(1+C_1/C_2)$, $G_4 = (K_4G_Y)(1+C_1/C_2)$, $G_C = G_Y\{K_4C_1+C_2+DRG_4^2/(C_1+C_2)\}/(C_2)(K_4-1)$, $G_D = G_C/\{(R)(G_4+G_C+G_Y) - 1\}$, $G_B = C_2(G_C+G_D)(C_1+C_2)/(RDG_4^2)$, $G_7 = [(G_C/C_1)\{(C_1+C_2)/(G_4G_D)+(C_2)/(G_YG_D+G_B/R)\}]^{-1}$, and $G_2 = C_2\{C_1G_4+G_7(C_1+C_2)\}/(G_4^2DR)$.

9. A frequency dependent negative resistor (FDNR) circuit which utilizes a single amplifier to provide a desired impedance function between an input terminal of the FDNR circuit and a terminal having a fixed reference potential, the circuit comprising:
- a differential amplifier having first and second input terminals and having an output terminal;
- a first conductance connected to the output terminal of the amplifier and to the first input terminal of the amplifier;
- a second conductance connected to the output terminal of the amplifier and to the second input terminal of the amplifier;
- a series branch circuit including a third conductance and a first capacitance connected between the FDNR input terminal and the first input of the amplifier;
- a fourth conductance coupling the FDNR input terminal to the second input of the amplifier;
- fifth and sixth conductances, respectively, coupling the first and second inputs of the amplifier to the reference terminal;
- a second capacitance directly coupling the output to a node between the third conductance and the first capacitance; and
- a seventh conductance directly connecting the output to the FDNR input terminal.

10. A circuit including an input terminal and further comprising,
- an amplifier having first and second inputs and an output,
- means coupling the output by way of a conductance $G_2$ to the first input and by way of a conductance $G_B$ to the second input,
- a series branch circuit including a conductance $G_4$ and a capacitance $C_1$ connected between the input terminal and the first input,
- a conductance $G_C$ coupling the input terminal to the second input,
- a conductance $G_D$ coupling the second input to ground,
- a capacitance $C_2$ directly coupling the output to a node between the conductance $G_4$ and the capacitance $C_1$, and
- a capacitance $C_7$ coupling the first input to ground, wherein an admittance between the input terminal and ground equals $G + Ds^2$, where G and D are real numbers and s is a complex frequency variable.

11. A circuit in accordance with claim 10 wherein $K > 1$, $G_A = G_C + G_D = K(1 + C_1/C_7)$, $\alpha = (C_7)(C_1 + C_2)^2/(C_1 C_2)(C_1 + C_7)$, $G_2 = (G_C)(K-1)/\alpha$, $G_4 = (G_C)(K-1)$, and $G_B = (C_1 C_2 G_A)/(C_7)(C_1 + C_2)$.

12. A frequency dependent negative resistor (FDNR) circuit which utilizes a single amplifier to provide a desired admittance function between an input terminal of the FDNR circuit and a terminal having a fixed reference potential, the circuit comprising:
- a differential amplifier having first and second input terminals and having an output terminal;
- a first conductance connected to the output terminal of the amplifier and to the first input terminal of the amplifier;
- a second conductance connected to the output terminal of the amplifier and to the second input terminal of the amplifier;
- a series branch circuit including a third conductance and a first capacitance connected between the FDNR input terminal and the first input of the amplifier;
- a fourth conductance coupling the FDNR input terminal to the second input of the amplifier;
- a fifth conductance coupling the second input of the amplifier to the reference terminal;
- a second capacitance directly coupling the output to a node between the third conductance and the first capacitance; and
- a third capacitance coupling the first input of the amplifier to the reference terminal.

* * * * *

UNITED STATES PATENT AND TRADEMARK OFFICE
CERTIFICATE OF CORRECTION

PATENT NO. : 4,132,966

DATED : January 2, 1979

INVENTOR(S) : Dan Hilberman

It is certified that error appears in the above-identified patent and that said Letters Patent are hereby corrected as shown below:

Col. 3, lines 31, 33, 35 and 36 (Equations 8, 9, 10, and 11) " $\neq$ " should read -- $\equiv$ --. Col. 4, line 20, (Eq. 21), " $\neq$ " should read -- $\equiv$ --. Col. 5, line 5, (Eq. 27), delete "$\lambda$"; line 63, (Eq. 41) " $\neq$ " should read -- $\equiv$ --. Col. 7, line 33 (claim 5), delete "$\lambda$".

Signed and Sealed this

Fourth Day of September 1979

[SEAL]

Attest:

LUTRELLE F. PARKER

*Attesting Officer*  *Acting Commissioner of Patents and Trademarks*